(12) United States Patent
Nomoto et al.

(10) Patent No.: US 6,992,490 B2
(45) Date of Patent: Jan. 31, 2006

(54) GROUND FAULT DETECTION DEVICE

(75) Inventors: Yoshikazu Nomoto, Utsunomiya (JP);
Takafumi Tsurumi, Utsunomiya (JP);
Toshiaki Ariyoshi, Utsunomiya (JP);
Mitsuteru Yano, Kawachi-gun (JP)

(73) Assignee: Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 10/831,829

(22) Filed: Apr. 26, 2004

(65) Prior Publication Data

US 2004/0212371 A1 Oct. 28, 2004

(30) Foreign Application Priority Data

Apr. 28, 2003 (JP) .............................. 2003-123641

(51) Int. Cl.
*G01R 31/02* (2006.01)

(52) U.S. Cl. .......................... 324/522; 324/509; 361/42

(58) Field of Classification Search ........ 324/509–511, 324/522, 524, 537; 361/42
See application file for complete search history.

(56) References Cited

U.S. PATENT DOCUMENTS

| 4,864,242 A | * | 9/1989 | Hurley ........................ 324/510 |
| 2003/0067723 A1 | * | 4/2003 | Suzui et al. .................. 361/42 |

FOREIGN PATENT DOCUMENTS

| JP | 4-12616 | 1/1992 |
| JP | 2838462 | 12/1998 |

* cited by examiner

*Primary Examiner*—Vincent Q. Nguyen
(74) *Attorney, Agent, or Firm*—Fish & Richardson P.C.

(57) ABSTRACT

A control section sets a positive side switching element of a positive side detection section and a negative side switching element of a negative side detection section to ON, thus outputting an ON signal. When the switching elements are set ON, a predetermined current outputted from a positive side constant current source and a negative side constant current source, or a portion of this current, flows through detection resistors. A ground fault decision section decides whether a ground fault has occurred in the positive or the negative side of a direct current power source, based upon the value of an output voltage detected by a positive side voltage detector, or upon the value of an output voltage detected by a negative side voltage detector. Ground faults are accurately detected with a simple structure.

4 Claims, 5 Drawing Sheets

GROUND FAULT DETECTION DEVICE

BACKGROUND OF THE INVENTION

1. Field of the Invention

The present invention relates to a ground fault detection device which, for example, is carried upon a vehicle or the like.

Priority is claimed on Japanese Patent Application No. 2003-123641, filed Apr. 28, 2003, the content of which is incorporated herein by reference.

2. Description of Related Art

Conventionally, there is, for example, a known method of ground fault detection, in which the presence or absence of occurrence of a ground fault at an appropriate position of a direct current circuit which is equipped with a high voltage direct current power source is detected by selectively switchover connecting a current detector or a voltage detector for ground fault detection to the anode side and the cathode side of the direct current circuit (for example, Japanese Patent Application Unexamined Publication No. 4-12616).

Furthermore, in this type of ground fault detection method, there is a known detection method, in which the power source voltage of the high voltage direct current power source is detected, and variation of the detection result of the current detector or of the voltage detector for ground fault detection due to variation of the power source voltage is compensated according to this detected value of the power source voltage (for example, Japanese Patent No. 2838462).

However, in the above described conventional ground fault detection method, there have been the drawbacks that it is necessary to provide a voltage detection section for detecting the power source voltage of the high voltage direct current power source, and also that a structure for compensating for variation of the detection results of the current detector or the voltage detector for ground fault detection, based upon the detection results of this voltage detection section, has been necessary, so that, as a whole, the structure of the device has become complicated.

The present invention has been made in the light of the above described problems, and an object thereof is to provide a ground fault detection device which can detect the presence or the absence of the occurrence of a ground fault at high accuracy, while avoiding excessive complication of the structure of the device.

SUMMARY OF THE INVENTION

In order to solve the above described problems, there is provided a ground fault detection device, comprising: a direct current power source which is carried by a vehicle; a ground fault detection resistor (for example, in the shown preferred embodiment of the present invention, the positive electrode side detection resistor 33a and the negative electrode side detection resistor 33b) and a protective resistor (for example, in the shown preferred embodiment of the present invention, the positive electrode side protective resistor 31a and the negative electrode side protective resistor 31b) which are connected in series between either a positive terminal (for example, in the shown preferred embodiment of the present invention, the positive electrode side terminal 11A) or a negative terminal (for example, in the shown preferred embodiment of the present invention, the negative electrode side terminal 11B) of the direct current power source, and a ground of the vehicle; a constant current source (for example, in the shown preferred embodiment of the present invention, the positive electrode side constant current source 34a and the negative electrode side constant current source 34b) which is connected between the other one of the positive terminal and the negative terminal of the direct current power source, and the ground of the vehicle; and a detection means (for example, in the shown preferred embodiment of the present invention, the positive electrode side voltage detector 35a, the negative electrode side voltage detector 35b, and the ground fault decision section 24) which measures the terminal voltage which is present between the two ends of the ground fault detection resistor, and which detects the presence or the absence of the occurrence of a ground fault between the ground of the vehicle and the positive terminal or the negative terminal of the direct current power source, based upon the measured value of said the voltage.

According to a ground fault detection device of the above described construction, the terminal voltage which is present between both the ends of the ground fault detection resistor changes according to the resistance value of this ground fault detection resistor and according to the current value of the current which flows through this ground fault detection resistor, and it does not depend upon the output voltage of the direct current power source. In other words, if no ground fault is occurring, the predetermined current which is outputted from the constant current source flows through the ground fault detection resistor, while, when a ground fault which exhibits an appropriate ground fault resistance occurs, this predetermined current which is outputted from the constant current source is divided between the ground fault detection resistor and the ground fault resistance. Due to this, it is possible to determined that a ground fault has occurred, if the terminal voltage which is present between the two ends of the ground fault detection resistor has become smaller than a predetermined voltage value according to, for example, the resistance value of the ground fault detection resistor and the current value of the predetermined current which is outputted from the constant current source. Because of this, even in a case such as one in which the output voltage of a direct current power source such as a battery or a capacitor or the like which is carried upon a vehicle, for example, changes relatively greatly due to the operational state of the vehicle or the like, it is possible to detect the presence or absence of occurrence of a ground fault with high accuracy and reliability without necessitating to provide, for example, any special construction for detecting the output voltage of this direct current power source, or for compensating the measured value of the terminal voltage according to this detected value.

Moreover, by providing the constant current source, it is possible to prevent current of an excessively great value from flowing through the ground fault detection resistor or through other components of the circuit system, so that it is possible to simplify the structure, since it is not necessary to provide any special construction such as, for example, an excess current protection device or the like.

Preferably, the ground fault detection device as described above, further comprises, between the ground fault detection resistor and the protective resistor, a switching element (for example, in the shown preferred embodiment of the present invention, the positive electrode side switching element 32a and the negative electrode side switching element 32b) which performs connection and disconnection of the ground fault detection resistor and the protective resistor, and which disconnects the ground fault detection resistor and the protective resistor when the terminal voltage which is present between the two ends of said ground fault detection resistor is greater than a predetermined value (for example, in the shown preferred embodiment of the present invention, the protective voltage Vgate).

According to a ground fault detection device of the above described construction, it is possible to prevent an excessively great voltage from being applied to the ground fault detection resistor, even if, for example, during the execution of ground fault detection processing or the like, the direct current power source should intentionally be grounded via the ground fault detection resistor and the protective resistor.

Preferably, in the ground fault detection device as described above, a predetermined protective voltage is set for the terminal voltage which is present between the both ends of the ground fault detection resistor such that the terminal voltage does not exceed the predetermined protective voltage.

Preferably, the ground fault detection device as described above, further comprises, between the ground fault detection resistor and the protective resistor, a switching element which performs connection and disconnection of the ground fault detection resistor and the protective resistor, and which disconnects the ground fault detection resistor and the protective resistor when the terminal voltage which is present between the both ends of the ground fault detection resistor is greater than the predetermined protective voltage.

DESCRIPTION OF THE PREFERRED EMBODIMENTS

In the following, preferred embodiments of the ground fault detection device of the present invention will be described with reference to the appended drawings.

The ground fault detection device 10 according to this preferred embodiment of the present invention is mounted to a vehicle such as, for example, a fuel cell vehicle or a hybrid vehicle or the like, and it detects ground faults, in other words the presence or absence of insulation breakdown, occurring upon the positive electrode side or upon the negative electrode side of a non-earthed direct current power source 11 (hereinafter simply termed a direct current power source) which is electrically insulated from the vehicle chassis, which, for example, is earthed.

Figure 1:
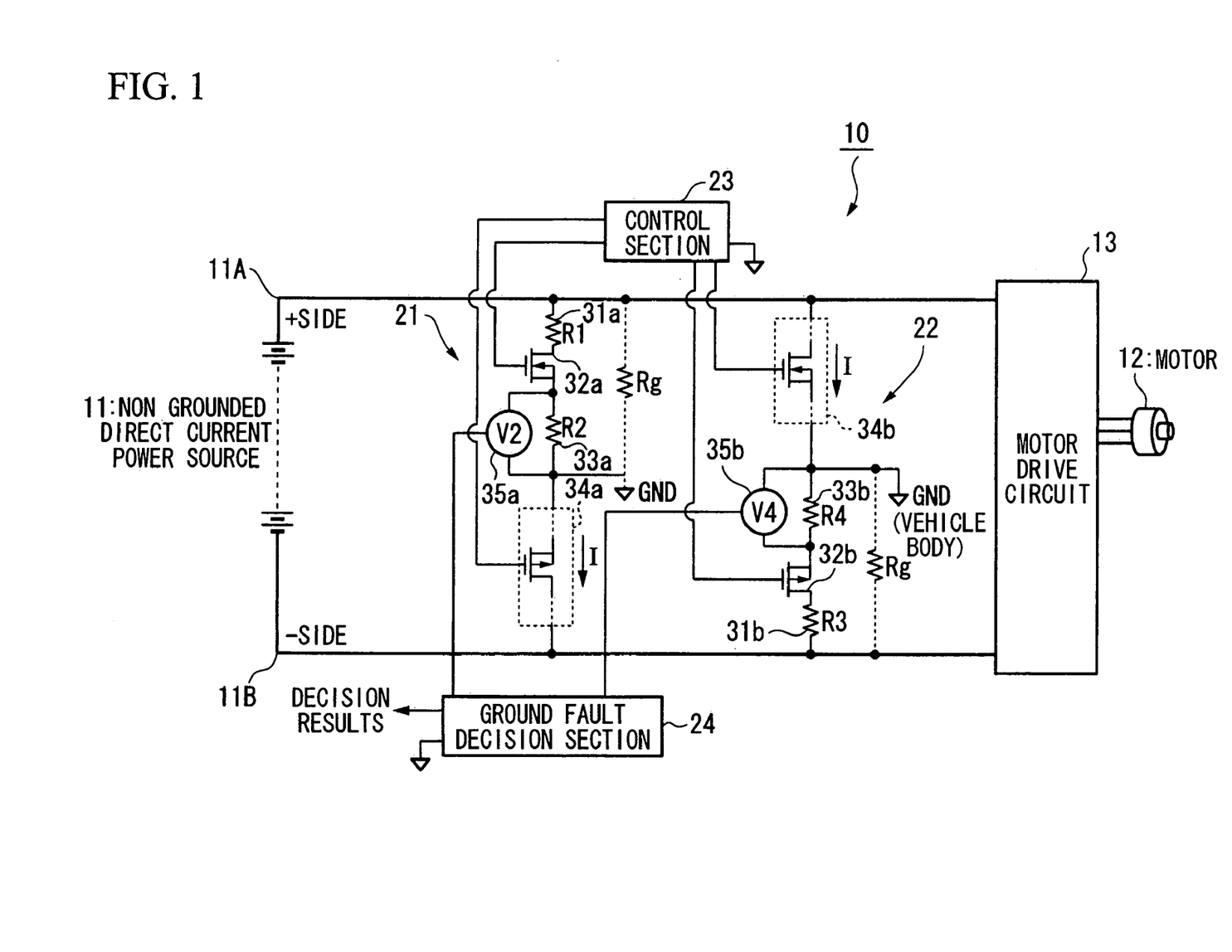
FIG. 1 is a structural diagram of a ground fault detection device according to a preferred embodiment of the present invention.

Here, the direct current power source 11 is a capacitor in which a plurality of capacitor cells such as, for example, electric double layered condensers or electrolytic condensers or the like are connected in series, or is a battery in which a plurality of cells (for example secondary cells such as lithium ion cells or the like) are connected in series; and, as for example shown in FIG. 1, it is also connected to a motor drive circuit 13 which controls the drive operation and the regenerative operation of a motor 12 which acts as a drive power source for the vehicle.

Furthermore, the motor drive circuit 13 comprises a PWM inverter which acts as a pulse width modulator (PWM), and which, for example, consists of a switching circuit in which a plurality of switching elements such as transistors or the like are used in a bridge connected configuration, and it has the function of, for example, sequentially supplying electricity in a commutating manner to a plurality of groups of fixed windings of the motor 12.

In other words, when for example the motor 12 is to be driven, based upon a torque command which is outputted from a motor control device (not shown), the motor drive circuit 13 converts direct current electrical power which is supplied from the direct current power source 11 into alternating current electrical power, and supplies it to the motor 12. On the other hand, when for example during regenerative operation the vehicle is to be decelerated or the like and drive power is transmitted to the motor 12 from its drive shaft, the motor drive circuit 13 operates the motor 12 as a generator; in other words, so as to generate regenerative damping force, so that the energy of motion of the vehicle is recuperated as electrical energy.

The ground fault detection device 10 according to this preferred embodiment of the present invention, as for example shown in FIG. 1, comprises a positive electrode side detection section 21 and a negative electrode side detection section 22 which are connected in parallel to the direct current power source 11, a control section 23, and a ground fault decision section 24.

The positive electrode side detection section 21, for example, comprises, connected in series in order from the positive electrode side terminal 11A of the direct current power source 11 towards its negative electrode side terminal 11B, a positive electrode side protective resistor 31a (whose resistance value is R1), a positive electrode side switching element 32a, a positive electrode side detection resistor 33a (whose resistance value is R2), and a positive electrode side constant current source 34a; and also comprises a positive electrode side voltage detector 35a which is connected in parallel with the positive electrode side detection resistor 33a.

Similarly, the negative electrode side detection section 22, for example, comprises, connected in series in order from the negative electrode side terminal 11B of the direct current power source 11 towards its positive electrode side terminal 11A, a negative electrode side protective resistor 31b (whose resistance value is R3), a negative electrode side switching element 32b, a negative electrode side detection resistor 33b (whose resistance value is R4), and a negative electrode side constant current source 34b; and also comprises a negative electrode side voltage detector 35b which is connected in parallel with the negative electrode side detection resistor 33b.

Here, the positive electrode side switching element 32a, for example, may be a FET such as a n channel MOSFET (Metal Oxide Semiconductor Field Effect Transistor) or the like, whose drain is connected to the positive electrode side protective resistor 31a, whose source is connected to the positive electrode side detection resistor 33a, and whose gate is connected to the control section 23.

Similarly, the negative electrode side switching element 32b, for example, may be a FET such as a p channel MOSFET or the like, whose drain is connected to the negative electrode side protective resistor 31b, whose source is connected to the negative electrode side detection resistor 33b, and whose gate is connected to the control section 23.

Furthermore, the connection between the positive electrode side detection resistor 33a and the positive electrode side constant current source 34a, and the connection between the negative electrode side detection resistor 33b and the negative electrode side constant current source 34b, may for example be earthed by connection via the chassis of the vehicle or the like.

Figure 2:
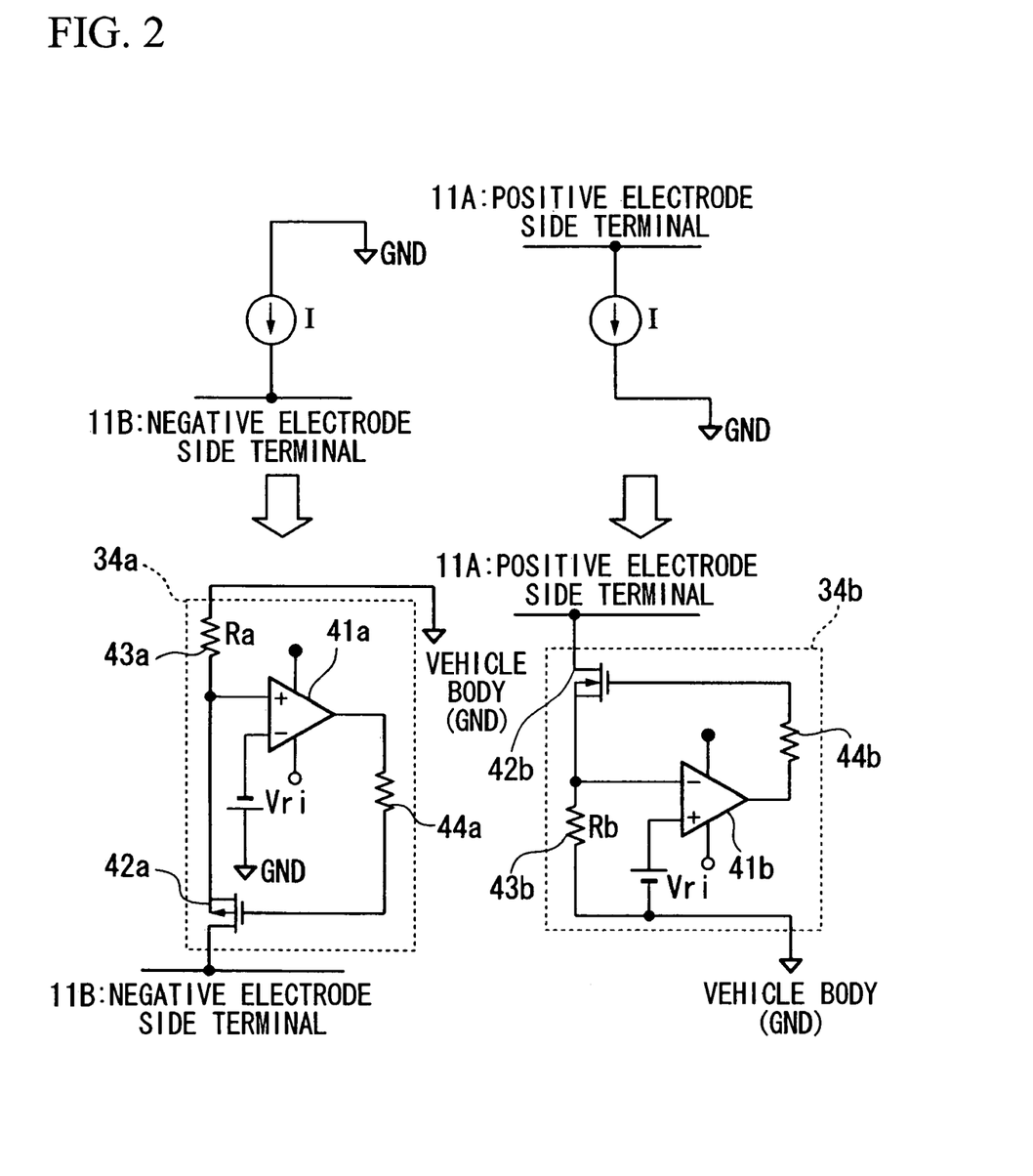
FIG. 2 is a structural diagram of a positive electrode side constant current source and a negative electrode side constant current source shown in FIG. 1.

The positive electrode side constant current source 34a, as for example shown in FIG. 2, may comprise an op-amp 41a, a switching element 42a which may be made from a FET such as, for example, a p channel MOSFET or the like, a resistor 43a (whose resistance value is Ra), and a current limitation resistor 44a.

One of the terminals of the resistor 43a is earthed by being connected to the positive electrode side detection resistor 33a, while its other terminal is connected to the non inverting input terminal of the op-amp 41a and to the source of the switching element 42a. Furthermore, the drain of the switching element 42a is connected to the negative electrode side terminal 11B of the direct current power source 11, while the gate of this switching element 42a is connected via the current limitation resistor 44a to the output terminal of the op-amp 41a.

Here, an appropriate standard voltage Vri is inputted to the inverting input terminal of the op-amp 41a, and a voltage (I×Ra) corresponding to the current I which flows in the resistor 43a is inputted to the non inverting input terminal of the op-amp 41a, so that, if the difference between this voltage (I×Ra) and the standard voltage Vri is termed $\Delta V=(I \times Ra - Vri)$, a voltage $Am \times \Delta V$ which is obtained by amplifying this difference $\Delta V$ by an appropriate gain Am is inputted from the op-amp 41a to the base of the switching element 42a. Thus, the potential of the source of the switching element 42a, in other words the voltage which is inputted to the non inverting input terminal of the op-amp 41a, becomes the value $(Am \times \Delta V + Vf)$ which is obtained by adding the forward direction voltage Vf at the PN junction between the gate and the source terminals of the switching element 42a to the voltage $Am \times \Delta V$ which is inputted to the base, but when, for example, the gain Am is for example set to a sufficiently large value, this value becomes almost equal to the standard voltage Vri, so that the current I which is flowing in the resistor 43a becomes a fixed current value (for example Vri/Ra).

Due to this, the value of the current I which is flowing in the resistor 43a is limited so as to become a value less than an appropriate current value which corresponds to the standard voltage Vri.

It should be understood that the standard voltage Vri which is inputted to the inverting input terminal of the op-amp 41a and the voltage (I×Ra) which is inputted to its non inverting input terminal are made to be negative voltages.

In the same manner, as for example shown in FIG. 2, the negative electrode side constant current source 34b is made up of an op-amp 41b, a switching element 42b which consists of, for example, a FET such as an n channel MOSFET or the like, a resistor 43b (of resistance value Rb), and a current limitation resistor 44b.

One of the terminals of the resistor 43b is earthed by being connected to the negative electrode side detection resistor 33b, while its other terminal is connected to the inverting input terminal of the op-amp 41b and to the source of the switching element 42b. Furthermore, the drain of the switching element 42b is connected to the positive electrode side terminal 11A of the direct current power source 11, while the gate of this switching element 42b is connected via the current limitation resistor 44b to the output terminal of the op-amp 41b.

Here, an appropriate standard voltage Vri is inputted to the inverting input terminal of the op-amp 41b, and a voltage (I×Rb) corresponding to the current I which flows in the resistor 43b is inputted to the inverting input terminal of the op-amp 41b, so that, if the difference between this voltage (I×Rb) and the standard voltage Vri is termed $\Delta V=(I \times Rb - Vri)$, a voltage $Am \times \Delta V$ which is obtained by amplifying this difference $\Delta V$ by an appropriate gain Am is inputted from the op-amp 41b to the base of the switching element 42b. Thus, the potential of the source of the switching element 42b, in other words the voltage which is inputted to the inverting input terminal of the op-amp 41b, becomes the value $(Am \times \Delta V - Vf)$ which is obtained by subtracting the forward direction voltage Vf at the PN junction between the gate and the source terminals of the switching element 42b from the voltage $Am \times \Delta V$ which is inputted to the base, but when, for example, the gain Am is for example set to a sufficiently large value, this value becomes almost equal to the standard voltage Vri, so that the current I which is flowing in the resistor 43b becomes a fixed current value (for example Vri/Rb).

Due to this, the value of the current I which is flowing in the resistor 43b is limited so as to become a value less than an appropriate current value which corresponds to the standard voltage Vri.

It should be understood that the standard voltage Vri which is inputted to the non inverting input terminal of the op-amp 41b and the voltage (I×Rb) which is inputted to its inverting input terminal are made to be positive voltages.

The current section 23 controls switching over of the ON/OFF of the positive electrode side switching element 32a of the positive electrode side detection section 21 and of the negative electrode side switching element 32b of the negative electrode side detection section 22, and executes switchover control of the ON/OFF of the switching elements 42a and 42b of the positive electrode side constant current source 34a and of the negative electrode side constant current source 34b.

For example, when executing ground fault detection processing, the control section 23 inputs to the bases of each of the switching elements 32a and 32b an ON signal which sets the positive electrode side switching element 32a of the positive electrode side detection section 21 and the negative electrode side switching element 32b of the negative electrode side detection section 22 to the ON state. On the other hand, when not executing ground fault detection processing, it inputs to these bases an OFF signal which sets these switching elements 32a and 32b to the OFF state.

During execution of ground fault detection processing, when the positive electrode side switching element 32a of the positive electrode side detection section 21 is set to the ON state by the control section 23, the predetermined current I which is supplied from the positive electrode side constant current source 34a flows through the positive electrode side protective resistor 31a and the positive electrode side detection resistor 33a; while, when the negative electrode side switching element 32b of the negative electrode side detection section 22 is set to the ON state by the control section 23, the predetermined current I which is supplied from the negative electrode side constant current source 34b flows through the negative electrode side protective resistor 31b and the negative electrode side detection resistor 33b.

Here, if for example a ground fault has occurred at some position in the positive electrode side of the direct current power source 11, then the predetermined current I which is supplied from the positive electrode side constant current source 34a is divided up, with a proportion thereof flowing through a ground fault resistance Rg which is of an appropriate magnitude depending upon this ground fault.

Figure 3:
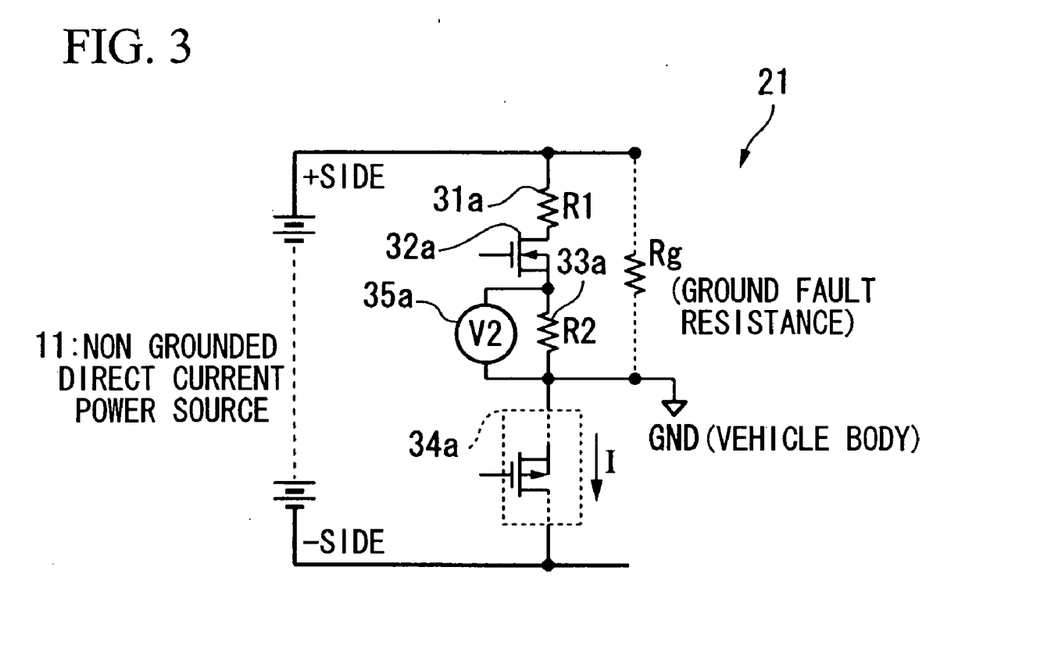
FIG. 3 is a structural diagram of a positive electrode side detection section shown in FIG. 1.

In other words, as for example shown in FIG. 3, if no ground fault is occurring, the predetermined current I which is being supplied from the positive electrode side constant current source 34a flows, in order, through the direct current power source 11, the positive electrode side protective resistor 31a, the positive electrode side switching element 32a, and the positive electrode side detection resistor 33a.

On the other hand, if a ground fault has in fact occurred, the predetermined current I which is being supplied from the positive electrode side constant current source 34a is separated into, for example, a first current component IA and a second current component IB (where I=IA+IB), and the first current component IA flows, in order, through the direct current power source 11, the positive electrode side protective resistor 31a, the positive electrode side switching element 32a, and the positive electrode side detection resistor 33a, while the second current component IB flows, in order, through the direct current power source 11 and the ground fault resistance Rg.

Due to this, the voltage value V2 of the output voltage which is detected by the positive electrode side voltage detector 35a which is connected in parallel to the positive electrode side detection resistor 33a becomes V2=I×R2 if no ground fault is occurring, while, if a ground fault is occurring, it becomes V2=IA×R2, so that the magnitude of this voltage value V2 which is detected changes.

It should be understood that the voltage value V2=IA×R2 of the output voltage which is detected when a ground fault is occurring becomes a value which does not depend upon the output voltage of the direct current power source 11, as shown for example by the following Equation 1:

Equation 1

$$V2 = \frac{R2 \cdot Rg}{R1 + R2 + Rg} I \qquad (1)$$

Figure 4:
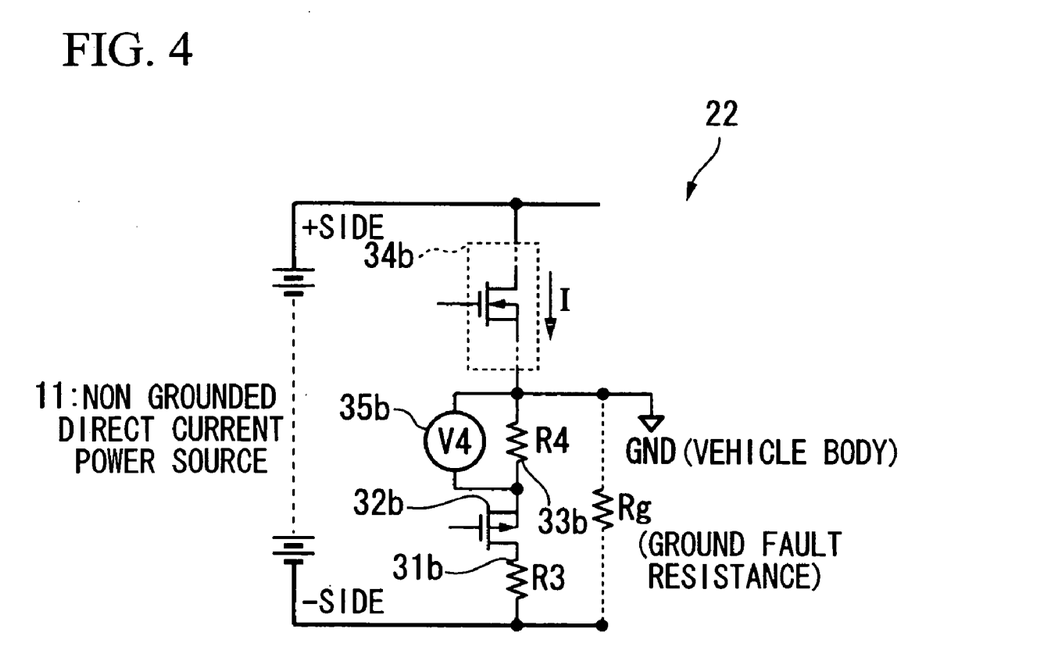
FIG. 4 is a structural diagram of a negative electrode side detection section shown in FIG. 1.

In the same manner, if for example a ground fault has occurred at some position in the negative electrode side of the direct current power source 11, then the predetermined current I which is supplied from the negative electrode side constant current source 34b is divided up, with a proportion thereof flowing through a ground fault resistance Rg which is of an appropriate magnitude depending upon this ground fault.

In other words, as for example shown in FIG. 4, if no ground fault is occurring, the predetermined current I which is being supplied from the negative electrode side constant current source 34b flows, in order, through the negative electrode side detection resistor 33b, the negative electrode side switching element 32b, the negative electrode side protective resistor 31b, and the direct current power source 11.

On the other hand, if a ground fault has in fact occurred, the predetermined current I which is being supplied from the negative electrode side constant current source 34b is separated into, for example, a first current component IA and a second current component IB (where I=IA+IB), and the first current component IA flows, in order, through the negative electrode side detection resistor 33b, the negative electrode side switching element 32b, the negative electrode side protective resistor 31b, and the direct current power source 11, while the second current component IB flows, in order, through the ground fault resistance Rg and the direct current power source 11.

Due to this, the voltage value V4 of the output voltage which is detected by the negative electrode side voltage detector 35b which is connected in parallel to the negative electrode side detection resistor 33b becomes V4=I×R4 if no ground fault is occurring, while, if a ground fault is occurring, it becomes V4=IA×R4, so that the magnitude of this voltage value V4 which is detected changes.

It should be understood that the voltage value V4=IA×R4 of the output voltage which is detected when a ground fault is occurring becomes a value which does not depend upon the output voltage of the direct current power source 11, as shown for example by the following Equation 2:

Equation 2

$$V4 = -\frac{R4 \cdot Rg}{R3 + R4 + Rg} I \qquad (2)$$

Furthermore, during the execution of ground fault detection processing, when the positive electrode side switching element 32a of the positive electrode side detection section 21 or the negative electrode side switching element 32b of the negative electrode side detection section 22 is set to the ON state by the control section 23, the direct current power source 11 is grounded by being connected, via the positive electrode side protective resistor 31a and the positive electrode side detection resistor 33a, or via the negative electrode side protective resistor 31b and the negative electrode side detection resistor 33b, to, for example, the vehicle chassis or the like.

Due to this, when the current which is flowing through the positive electrode side protective resistor 31a and the positive electrode side detection resistor 33a exceeds a predetermined current value and becomes excessively great, the control section 23 sets the positive electrode side switching element 32a to the OFF state and outputs an OFF signal; while, similarly, when the current which is flowing through the negative electrode side protective resistor 31b and the negative electrode side detection resistor 33b exceeds a predetermined current value and becomes excessively great, the control section 23 sets the negative electrode side switching element 32b to the OFF state and outputs an OFF signal.

Figure 5:
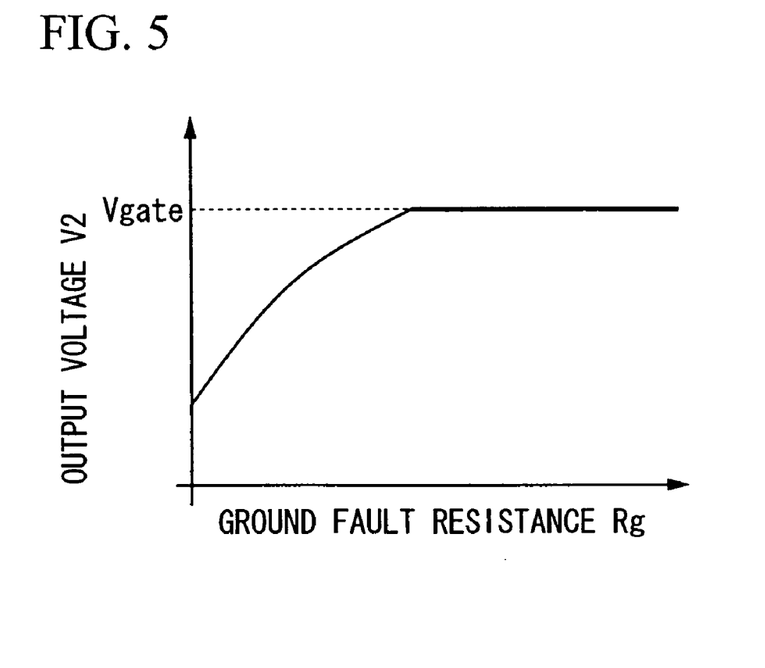
FIG. 5 is a graph showing the variation corresponding to a ground fault resistance Rg of the voltage value V2 of an output voltage which is detected by the positive electrode side voltage detector, and a predetermined protective voltage Vgate.

In other words, as for example shown in FIG. 5, the predetermined protective voltage Vgate is set for the voltage value V2 of the output voltage which is present between both the ends of the positive electrode side detection resistor 33a and which is detected by the positive electrode side voltage detector 35a, so that, in circumstances such as when for example no ground fault or the like is occurring or the like, so that the ground fault resistance Rg is relatively great, then the voltage value V2 of the output voltage is set so as not to exceed the protective voltage Vgate. In the same manner, the voltage value V4 of the output voltage which is present between both the ends of the negative electrode side detection resistor 33b and which is detected by the negative electrode side voltage detector 35b is set so as not to exceed the predetermined protective voltage Vgate.

The ground fault decision section 24 makes a decision as to whether or not a ground fault has occurred upon the positive electrode side or upon the negative electrode side of the direct current power source 11, based upon the voltage value V2 of the output voltage which is detected by the positive electrode side voltage detector 35a or the voltage value V4 of the output voltage which is detected by the negative electrode side voltage detector 35b.

For example, the ground fault decision section 24 may make a decision as to whether or not the voltage value V2 or the voltage value V4 which has been detected is less than a predetermined ground fault decision threshold voltage $V_{earth}$, and, if it has determined that the voltage value V2 or the voltage value V4 which has been detected is less than the predetermined ground fault decision threshold voltage $V_{earth}$, then it may decide that a ground fault is occurring, and may output the result of this decision, for example, to a warning device (not shown), or the like.

As has been described above, according to the ground fault detection device 10 of this preferred embodiment of the present invention, the output voltages which are present between both the ends of the detection resistors 33a and 33b vary according to the resistance values R2 and R4 of these detection resistors 33a and 33b, and according to the values of the currents which are flowing through these detection resistors 33a and 33b, and do not depend upon the output voltage of the direct current power source 11. Due to this, even in a case such as one in which the output voltage of the direct current power source 11 such as a battery or a capacitor or the like which, for example, is fitted to the vehicle, varies relatively greatly according to the operational state of the vehicle or the like, still there is no requirement for the provision of a special structure for detecting the output voltage of the direct current power source 11, and for compensating, according to the detected value thereof, the measured value of the output voltage which is present between both the ends of the detection resistors 33a and 33b; and, nevertheless, according to the present invention, it is possible to detect the occurrence of ground faults with high accuracy and reliability.

Moreover, by providing the constant current sources 34a and 34b, it is possible to prevent excessively great current from flowing in the detection resistors 33a and 33b and in the general circuit system, so that it is possible to simplify the structure of the device, since it is not necessary to provide any special structure such as, for example, an excess current protective device or the like.

It should be understood that although, in the above described preferred embodiment of the present invention, the switching elements 42a and 42b of the positive electrode side constant current source 34a and of the negative electrode side constant current source 34b were specified as being made with FETs such as MOSFETs or the like, the present invention is not to be considered as being limited by this constructional detail; it is also be possible to employ, for example, transistors or the like for these switching elements 42a and 42b.

Furthermore, it is also possible, by outputting from the control section 23 an ON signal which set the switching elements 42a and 42b to the ON state, or an OFF signal which set them to the OFF state, according to the state of execution of ground fault detection processing and the like, for example, to restrict the current value of the current I flowing through the resistors 43a and 43b, so as to keep its value below an appropriate current value corresponding to the standard voltage Vri.

Figure 6:
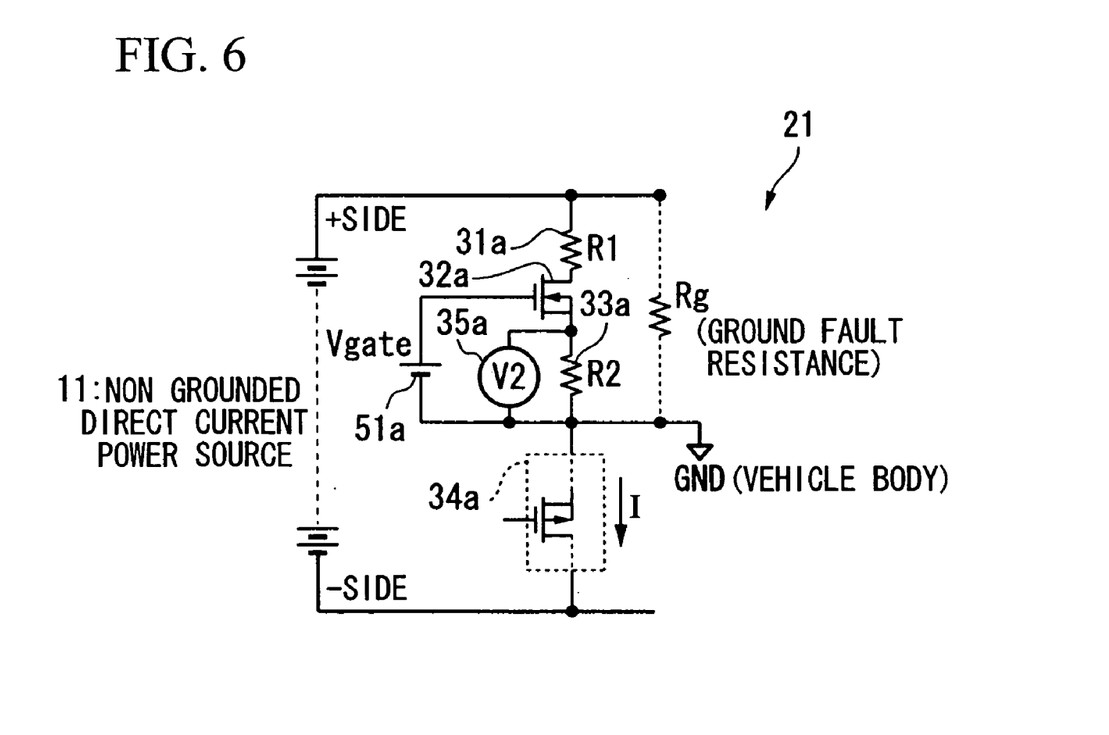
FIG. 6 is a structural diagram of a positive electrode side detection section of a variant embodiment of this preferred embodiment.
Figure 7:
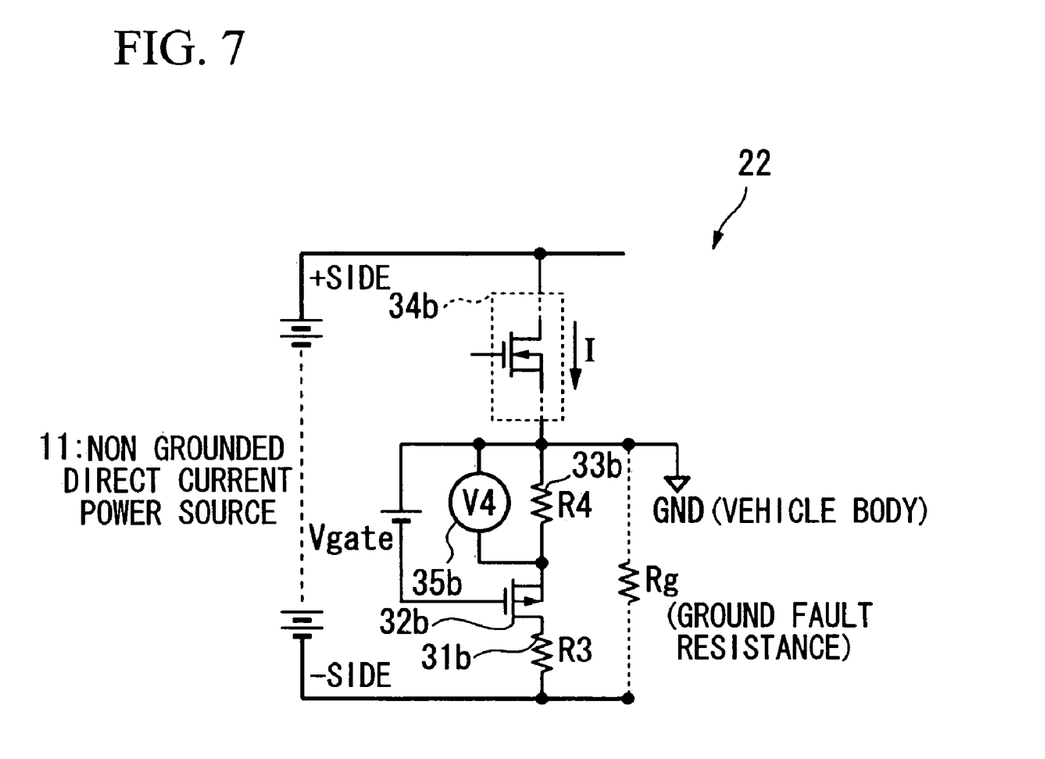
FIG. 7 is a structural diagram of a negative electrode side detection section of a variant embodiment of this preferred embodiment.

It should be understood that although, in the above described preferred embodiment of the present invention, the switchover control of the ON/OFF of the positive electrode side switching element 32a of the positive electrode side detection section 21 and of the negative electrode side switching element 32b of the negative electrode side detection section 22 was performed by the ON/OFF signal from the control section 23, the present invention should not be considered as being limited by this arrangement; for example, as in the positive electrode side detection section 21 and the negative electrode side detection section 22 of the variant preferred embodiment shown in FIGS. 6 and 7, it is also, alternatively, be possible to connect the source of the positive electrode side switching element 32a which consists, for example, of a MOSFET or the like to the base of this positive electrode side switching element 32a via the positive electrode side detection resistor 33a and a power source 51a which outputs a predetermined protective voltage Vgate, and, in the same manner, to connect the source of the negative electrode side switching element 32b which consists, for example, of a MOSFET or the like to the base of this negative electrode side switching element 32b via the negative electrode side detection resistor 33b and a power source 51b which outputs the predetermined protective voltage Vgate. According to a source follower circuit of this kind, the voltage value V2 of the output voltage which is present between the two ends of the positive electrode side detection resistor 33a and the voltage value V4 of the output voltage which is present between the two ends of the negative electrode side detection resistor 33b may be set so as not to exceed the predetermined protective voltage Vgate, and accordingly it is possible to perform high voltage cutoff and excess voltage protection by this setting so as not to exceed the predetermined protective voltage Vgate.

As has been explained above, according to the ground fault detection device of the present invention, even in a case such as one in which the output voltage of the direct current power source which is carried upon the vehicle varies relatively greatly in correspondence to, for example, the operational state of the vehicle, it is still possible to detect the presence or absence of occurrence of a ground fault with high accuracy and reliability without necessitating to provide, for example, any special construction for detecting variation of the output voltage of this direct current power source, or for compensating the measured value of this terminal voltage according to the results of this detection. Moreover, by providing the constant current sources, it is possible to prevent an excessively large current value from flowing in the ground fault detection resistors or in any part of the circuit system.

Furthermore, according to the ground fault detection device of the present invention, it is possible to prevent voltage of an excessive level from being applied to the ground fault detection resistor.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A ground fault detection device, comprising:
   a direct current power source which is carried by a vehicle;
   a ground fault detection resistor and a protective resistor which are connected in series between either a positive terminal or a negative terminal of said direct current power source, and a ground of the vehicle;
   a constant current source which is connected between the other one of said positive terminal and said negative terminal of said direct current power source, and said ground of the vehicle; and
   a detection means which measures a terminal voltage which is present between both ends of said ground fault detection resistor, and which detects presence or absence of occurrence of a ground fault between said ground of the vehicle and the positive terminal or the negative terminal of said direct current power source, based upon a measured value of said terminal voltage.

2. The ground fault detection device according to claim 1, further comprising, between said ground fault detection resistor and said protective resistor, a switching element which performs connection and disconnection of said ground fault detection resistor and said protective resistor, and which disconnects said ground fault detection resistor and said protective resistor when said terminal voltage which is present between the both ends of said ground fault detection resistor is greater than a predetermined value.

3. The ground fault detection device according to claim 1, wherein a predetermined protective voltage is set for said terminal voltage which is present between the both ends of said ground fault detection resistor such that said terminal voltage does not exceed said predetermined protective voltage.

4. The ground fault detection device according to claim 3, further comprising, between said ground fault detection resistor and said protective resistor, a switching element which performs connection and disconnection of said ground fault detection resistor and said protective resistor, and which disconnects said ground fault detection resistor and said protective resistor when said terminal voltage which is present between the both ends of said ground fault detection resistor is greater than said predetermined protective voltage.

* * * * *